United States Patent
Song et al.

(10) Patent No.: US 7,352,035 B1
(45) Date of Patent: Apr. 1, 2008

(54) FLASH MEMORY DEVICES AND METHODS FOR FABRICATING FLASH MEMORY DEVICES

(75) Inventors: Jai-Hyuk Song, Seoul (KR); Jeong-Hyuk Choi, Seongnam-si (KR); Ok-Cheon Hong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/700,084

(22) Filed: Jan. 31, 2007

(30) Foreign Application Priority Data

Oct. 20, 2006 (KR) ............... 10-2006-0102571

(51) Int. Cl.
*H01L 29/788* (2006.01)
*H01L 21/8239* (2006.01)
*G11C 16/02* (2006.01)

(52) U.S. Cl. ............. 257/392; 438/258; 438/276; 365/185.01; 365/185.33; 257/E21.68

(58) Field of Classification Search ........... 257/392; 438/258, 276; 365/185.01, 185.33
See application file for complete search history.

(56) References Cited

U.S. PATENT DOCUMENTS

| 6,818,511 B2 | 11/2004 | Lee |
| 7,067,425 B2 | 6/2006 | Lee |

FOREIGN PATENT DOCUMENTS

| JP | 2004-146829 | 5/2004 |
| KR | 10-2005-0002414 | 1/2005 |
| KR | 10-2006-0032860 | 4/2006 |

*Primary Examiner*—Evan Pert
(74) *Attorney, Agent, or Firm*—Lee & Morse, P.C.

(57) ABSTRACT

A flash memory device includes a cell string having a plurality of cell transistors connected in series, and a string selection transistor and a ground selection transistor connected to both ends of the cell string, respectively, wherein the cell transistor has a channel impurity concentration higher than a channel impurity concentration of at least one of the string selection transistor and the ground selection transistor.

20 Claims, 17 Drawing Sheets

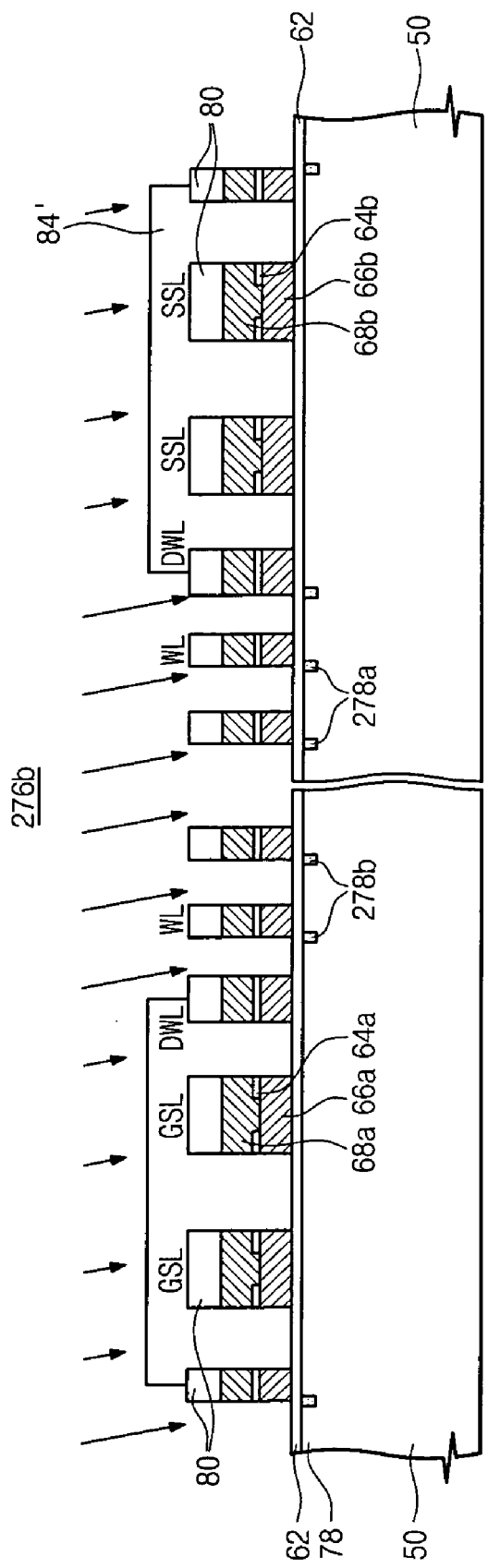

FLASH MEMORY DEVICES AND METHODS FOR FABRICATING FLASH MEMORY DEVICES

BACKGROUND OF THE INVENTION

1. Field of the Invention

The present invention relates to semiconductor devices and methods for fabricating semiconductor devices. More particularly, the invention relates to flash memory devices and methods for fabricating the same.

2. Description of the Related Art

A cell array of a memory device may include a plurality of cell transistors. In flash memory devices, a channel impurity concentration of the cell transistors constituting a cell array is, in general, closely related to a threshold voltage, a leakage current and/or a boosting efficiency. Accordingly, it is desired to provide cell transistors, which are employable by memory devices, and which have reduced current leakage characteristics, reduced dispersion of channel impurity concentration and an appropriate impurity concentration at each region.

In some cases, to compensate for lower impurity concentrations at a surface of an active region as a result of, e.g., high temperatures and/or etching solutions used to form an insulation layer and/or a trench region defining the active region, a higher dose of impurity has been supplied. However, when a channel impurity layer is formed by increasing a dose of impurity, gate induced drain leakage (GIDL) may occur around, e.g., a selection transistor of a NAND-type flash memory device, and may thereby deteriorate boosting efficiency.

SUMMARY OF THE INVENTION

The present invention is therefore directed to semiconductor devices and methods of forming semiconductor devices, which substantially overcome one or more of the problems due to the limitations and disadvantages of the related art.

It is therefore a feature of an embodiment of the present invention to provide a method for compensating for a concentration drop resulting from impurity diffusion while reducing and/or preventing an increase in an overall concentration of a channel impurity layer.

It is therefore a separate feature of an embodiment of the present invention to provide a flash memory device having stable cell characteristics.

It is therefore a separate feature of an embodiment of the present invention to provide a flash memory device including a cell transistor having improved data maintaining characteristics.

It is therefore a separate feature of an embodiment of the present invention to provide a flash memory device including a cell transistor having a lower amount of GIDL around a selection transistor and having a high boosting efficiency.

It is therefore a separate feature of an embodiment of the present invention to provide a flash memory device including a cell transistor having improved data maintaining characteristics, having a lower amount of GIDL around a selection transistor and having a high boosting efficiency.

At least one of the above and other features and advantages of the present invention may be realized by providing a flash memory device, including a cell string having a plurality of cell transistors connected in series; and a string selection transistor and a ground selection transistor connected to both ends of the cell string, respectively, wherein the cell transistor has a channel impurity concentration higher than a channel impurity concentration of at least one of the string selection transistor and the ground selection transistor.

In a respective cell transistor of the cell transistors that is closest to one of the string selection transistor and the ground selection transistor, a channel portion adjacent to the string selection transistor or the ground selection transistor may have an impurity concentration lower than that of a channel portion adjacent to another cell transistor of the cell transistors. Each of the cell transistors may include a source region and a drain region, and impurity concentrations of channels adjacent to the source region and the drain region are higher than impurity concentrations of the string selection transistor and the ground selection transistor.

Each of the cell transistors may be disposed on an active region, and a channel impurity concentration at an edge of the active region is higher than an impurity concentration of at least one of the string selection transistor and the ground selection transistor. Each of the cell transistors may include a charge trap insulation layer, and a gate electrode formed on the charge trap insulation layer. The charge trap insulation layer may include a tunnel insulation layer, a charge trap layer formed on the tunnel insulation layer, and a blocking insulation layer formed on the charge trap layer. Each of the cell transistors may include a tunnel insulation layer, a floating gate formed on the tunnel insulation layer, an inter-gate dielectric layer formed on the floating gate, and a control gate electrode formed on the inter-gate dielectric layer.

The memory device may further include dummy cell transistors formed between at least one of the cell string selection transistor and at least one of the cell transistors and the ground selection transistor and at least on of the cell transistors. A channel portion adjacent to the cell string in the dummy transistor may have an impurity concentration higher than an impurity concentration of a channel portion adjacent to the ground selection transistor or the string selection transistor. The dummy cell transistor may have a stacked structure including same layers as the cell transistor.

At least one of the above and other features and advantages of the present invention may be separately realized by providing a method for fabricating a flash memory device including forming a cell string having a plurality of cell transistors connected in series, and a string selection transistor and a ground selection transistor connected to both ends of the cell string, respectively, on a semiconductor substrate, and implanting a channel impurity on the semiconductor substrate having the cell transistor, the string selection transistor, and the ground selection transistor, wherein the cell transistor has a channel impurity concentration higher than an impurity concentration of at least one of the string selection transistor and the ground selection transistor.

The method may include, before the forming of the cell string, the string selection transistor, and the ground selection transistor, implanting a channel impurity on the semiconductor substrate. Implanting the channel impurity may include implanting a first channel impurity on the semiconductor substrate, defining an active region by forming a device isolation layer on the semiconductor substrate, and implanting a second channel impurity on an edge of the active region, the edge constituting a boundary of the device isolation layer. Forming the cell string, the string selection transistor, and the ground selection transistor may include defining an active region on the semiconductor substrate, forming a gate electrode of the cell transistor, a gate electrode of the string selection transistor, a gate electrode of the ground selection transistor, the gate electrodes crossing over the active region, and implanting an additional channel impurity at bottom edge portions of the gate electrodes in the cell transistor.

Implanting the additional channel impurity may include forming a mask pattern covering active regions at both sides of the gate electrode of the string selection transistor and the gate electrode of the ground selection transistor, wherein the mask pattern may be used as an ion implantation mask to implant an additional channel impurity into the active region. The additional channel impurity may be implanted vertically into an active region between the gate electrodes of the cell transistor. The additional channel impurity may be implanted on an active region between the gate electrodes of the cell transistor using a tilted ion implantation method.

The method may further include forming gate electrodes of dummy cell transistors between a gate electrode at an edge of the cell string, the gate electrode of the string selection transistor, and the gate electrode of the ground selection transistor. Implanting the additional channel impurity may include forming a mask pattern covering active regions in both sides of the gate electrode of the string selection transistor and the gate electrode of the ground selection transistor, wherein the mask pattern may be used as an ion implantation mask to implant an additional channel impurity into the active region. The additional channel impurity may be implanted using at least one of a vertical ion implantation method and a tilted ion implantation method into an active region between the gate electrodes of the cell transistor, and between the gate electrode of the cell transistor and the gate electrode of the dummy cell transistor.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIGS. 7A and 7B illustrate partial cross-sectional views of the exemplary flash memory device shown in FIG. 1, taken along line II-II' of FIG. 1 for describing a method for fabricating a flash memory device according to a fifth exemplary embodiment of the present invention;

DETAILED DESCRIPTION OF THE INVENTION

Figure 1:
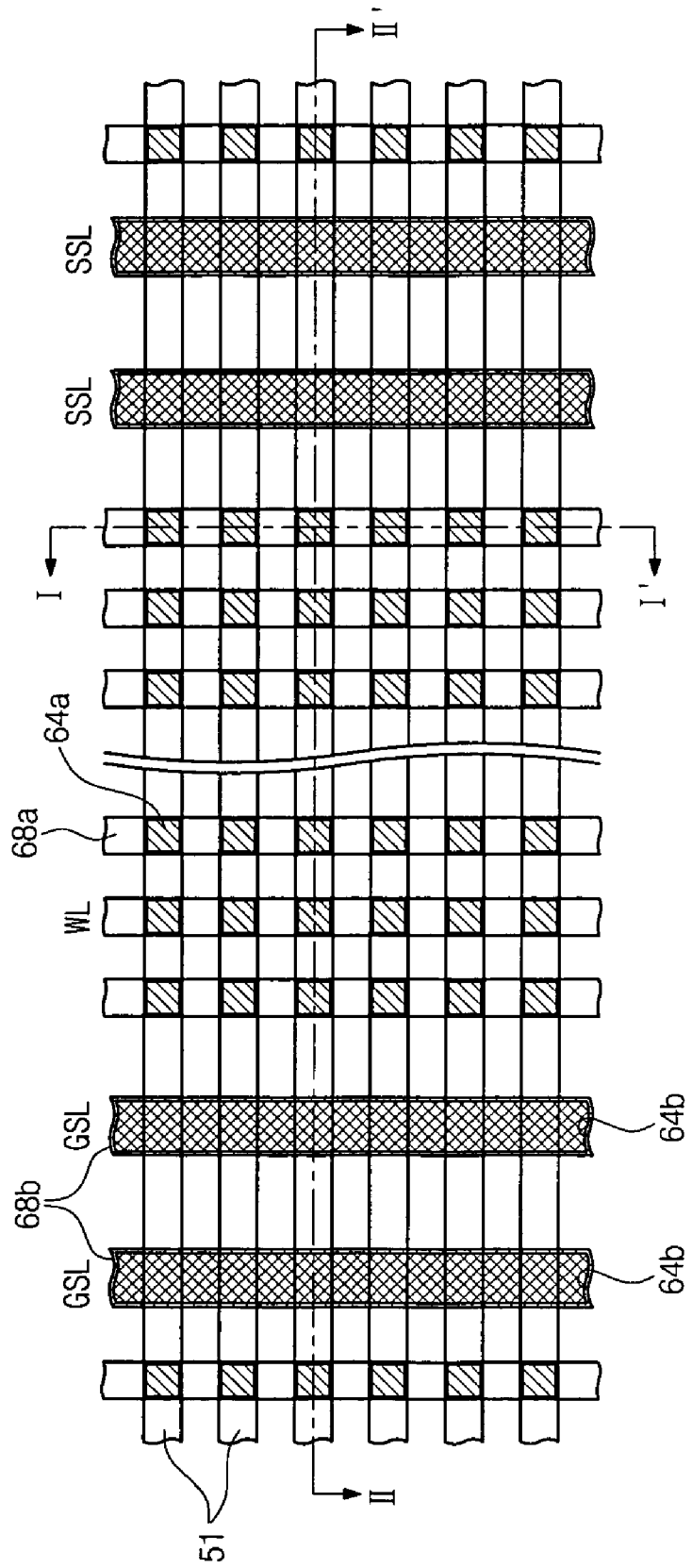
FIG. 1 illustrates a partial plan view of a first exemplary embodiment of a flash memory device according to one or more aspects of the present invention.

Korean Patent Application No. 2006-102571, filed on Oct. 20, 2006, in the Korean Intellectual Property Office, and entitled: "Flash Memory Device and Method for Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Hereinafter, exemplary embodiments of the invention will be described in conjunction with the accompanying drawings.

FIG. 1 illustrates a partial plan view of a first exemplary embodiment of a flash memory device according to one or more aspects of the present invention.

Referring to FIG. 1, a flash memory device may an array of cells, e.g., an array of NAND-type cells. A device isolation layer 72 (see FIG. 2B) may be formed on a semiconductor substrate 50 (see FIG. 2A) to define active region(s) 51. A gate electrode (ground selection line: GSL) of a ground selection transistor, a gate electrode (word line: WL) of a cell transistor, and a gate electrode (string selection line: SSL) of a string selection transistor may disposed so as to cross over the active regions 51. In embodiments of the invention, the gate electrode may include an electric conductor having a work function of 4.5 eV or higher.

The active regions 51 may be disposed parallel to each other in a cell array region. A plurality of word lines WL may be disposed between the ground selection line GSL and the string selection line SSL. An overlapping portion of the word line WL and the active region 51 may correspond to a channel of the cell transistor. An overlapping portion of the string selection line SSL and the active region 51 may correspond to a channel of the string selection transistor. An overlapping portion of the ground selection line GSL and the active region 51 may correspond to a channel of a ground selection transistor. A plurality of cell transistors may be connected in series in the active region 51, and may correspond to a cell string. The string selection transistor and the ground selection transistor may be connected to both ends of the cell string.

Figure 2A:
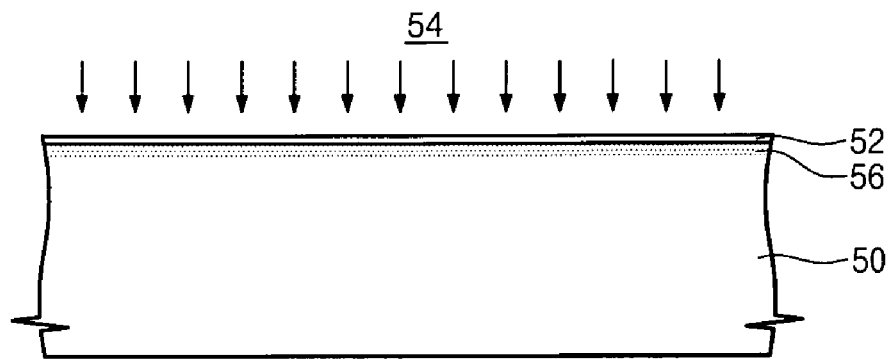
FIGS. 2A through 2C illustrate cross-sectional views of partial structures corresponding to structures that may be obtained while fabricating flash memory devices employable in the cell array shown in FIG. 1, taken along line I-I' of FIG. 1.
Figure 2B:
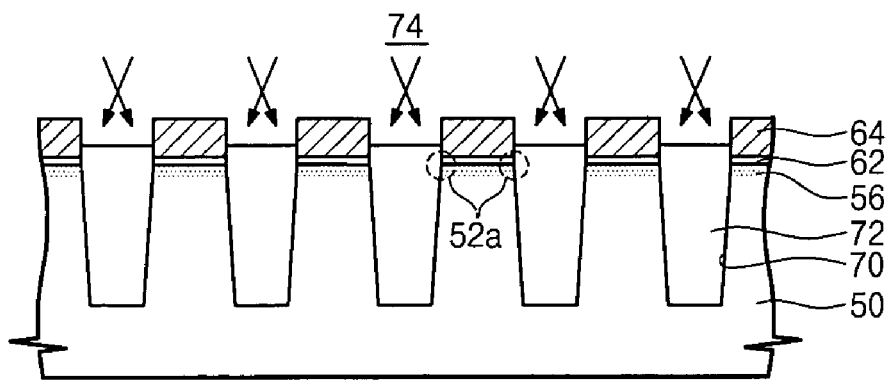
Figure 2C:
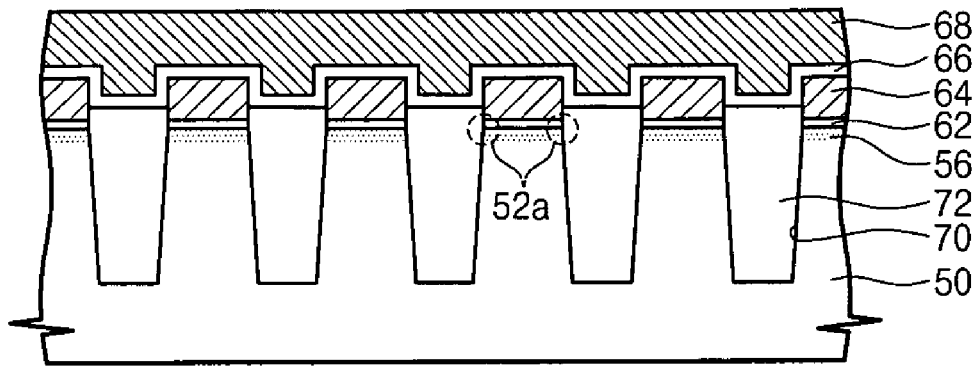

FIGS. 2A through 2C illustrate cross-sectional views of partial structures corresponding to structures that may be obtained while fabricating flash memory devices employable in the cell array shown in FIG. 1, taken along line I-I' of FIG. 1. More particularly, FIGS. 2A through 2C illustrate partial structures corresponding to stages in methods of fabricating flash memory devices according to one or more aspects of the invention, which may enable a reduction in impurity concentration at edges of the active region.

Referring to FIGS. 2A through 2C, the cell transistor may include a charge storing unit disposed between the word line WL and the active region 51. In embodiments of the invention, the charge storing unit may include, e.g., a floating gate 64a (see, e.g., FIG. 1) or a charge trapping layer 168 (see, e.g., FIG. 8).

More particularly, e.g., in embodiments of the invention including, e.g., the floating gate 64a, a control gate electrode 68a, which may be insulated using an inter-gate dielectric layer 66, may be formed on the floating gate 64a.

When the charge storing unit corresponds to a floating gate 64a, the ground selection line GSL and the string selection line SSL may include a bottom gate pattern 64b corresponding to the floating gate 64a, and a top gate pattern 68b corresponding to the control gate electrode 68a disposed on the bottom gate pattern 64b. In such cases, a dielectric layer corresponding to the inter-gate dielectric layer 66 may be interposed between the bottom gate pattern 64b and the top gate pattern 68b of the selection line(s) GSL, SSL. However, in some embodiments of the invention, e.g., for the selection lines GSL, SSL, such a dielectric layer 66 may only be partially interposed between the bottom gate pattern 64b and the top gate pattern 68b, the bottom gate pattern 64b may be connected to the top gate pattern 68b.

Where the charge storage unit corresponds to a charge trapping layer 168, the charge-trapping unit may include a gate insulation layer 62, i.e., tunnel insulation layer, a charge-trapping layer 168 formed on the tunnel insulation layer 62, and a blocking insulation layer formed on the charge-trapping layer 168. In such cases, the blocking insulation layer may include, e.g., a material having a higher dielectric constant than the tunnel insulation layer.

Referring to FIG. 2A, a buffer insulation layer 52 may be formed on a semiconductor substrate 50. First channel impurity(ies) 54 may be implanted on the semiconductor substrate 50 to form a first channel impurity layer 56. Implantation of the first channel impurity(ies) may be performed to adjust a threshold voltage of a transistor. In some embodiments of the invention, the first channel impurity layer 56 may have a concentration lower than a concentration corresponding to a threshold voltage target of a cell transistor.

Referring to FIG. 2B, after removing the buffer insulation layer 52, a gate insulation layer 62 and a floating gate layer 64 may be formed on the semiconductor substrate 50. The gate insulation layer 62 may have different characteristics at different regions of a memory device. For example, the gate insulation layer 62 may have a smaller thickness region(s) of the memory device where cell transistor(s) are formed, and the gate insulation layer 62 may have a greater thickness at a peripheral circuit region of the memory device, e.g., where ground selection transistor(s) and/or string selection transistor(s) are formed. The portion(s) of the gate insulation layer 62 formed at region(s) of the memory device where cell transistor(s) are formed may be referred to as a tunnel insulating layer.

In embodiments of the invention including a charge trapping-type flash memory device, the floating gate layer 64 may correspond to a portion of the control gate electrode 68a (see FIG. 1). The gate insulation layer 62 may be formed on a cell array region, and may correspond to a portion of a multi-layer structure of a charge trap insulation layer (not shown).

Referring to FIG. 2B, by patterning the floating gate layer 64, the gate insulation layer 62, and the semiconductor substrate 50, a trench region 70 may be formed on the semiconductor substrate 50. The device isolation layer 72 may fill the trench region 70, and may include an insulating material. Using known methods, a sidewall of the patterned floating gate layer 64 may be exposed by recessing a portion of the device isolation layer 72.

While forming the device isolation layer 72, impurity (ies), e.g., p-type impurity(ies), of the first channel impurity layer 56 may be diffused. Thus, a concentration of the first channel impurity layer 56 may decrease. In particular, impurity concentration of the first channel impurity layer 56 may be lower at edges 52a of the active region 51 (see FIG. 1), i.e., at a boundary between a respective device isolation layer 72 and the active region 51.

Referring to FIG. 3B, to compensate for such a decrease in impurity(ies), in some embodiments of the invention, a second channel impurity 74 may be implanted into the first channel impurity layer 56 to increase, i.e., compensate for, the concentration of the first channel impurity layer 56. In some embodiments of the invention, the second channel impurity(ies) 74 may be implanted using a tilted ion implantation method, and thus, the second channel impurity(ies) 74 may be implanted into the semiconductor substrate 50 under the floating gate layer 64. More particularly, in some embodiments of the invention, the second channel impurity (ies) 74 may be additionally implanted into the edge(s) 52a of the active region 51 having a relatively lower impurity concentration. Thus, a difference in impurity concentration at the edge(s) 52a of the active region 51 may be substantially or completely compensated for, i.e., a difference in impurity concentration along the first channel impurity layer 56 may be decreased and/or eliminated.

In some embodiments of the invention, the second channel impurity(ies) 74 may be selectively implanted only into a region where cell transistor(s) are to be formed. Thus, in such embodiments, e.g., a channel impurity concentration of a selection transistor of, e.g., a NAND array, may be maintained, i.e., an increase in impurity concentration of the selection transistor(s) as a result of the second channel impurity(ies) may be prevented. Further, in some embodiments of the invention, a target threshold voltage of a cell transistor may be adjusted by implanting the second impurity(ies) 74.

Referring to FIG. 2C, in embodiments of the invention including a floating gate-type flash memory device, an inter-gate dielectric layer 66 and a control gate layer 68 may be formed on the floating gate layer 64. A control gate electrode 68a (see FIG. 1) may then be patterned using, e.g., a photolithography process. In embodiments of the invention including a charge trapping-type flash memory device, a conductive layer (not shown) may be formed on the floating gate layer 64, which may be isolated by the device isolation layer 72, and a gate electrode 168a can be patterned with the conductive layer. In such cases, the floating gate layer 64 may correspond to a bottom portion of the gate electrode 168a.

Figure 3:
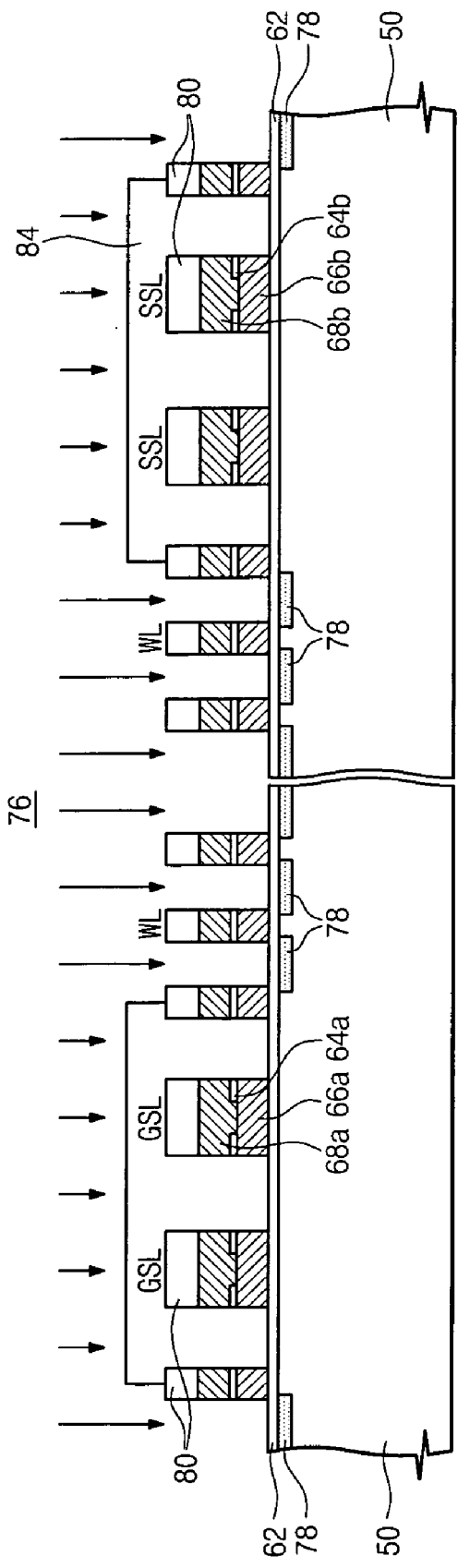
FIG. 3 illustrates a partial cross-sectional view of an exemplary flash memory device shown in FIG. 1, taken along line II-II' of FIG. 1 for describing a method for fabricating a flash memory device according to a first exemplary embodiment of the present invention.

FIG. 3 illustrates a cross-sectional view of the exemplary flash memory device shown in FIG. 1, taken along line II-II' of FIG. 1 for describing a method for fabricating a flash memory device according to a first exemplary embodiment of the present invention.

Referring to FIG. 3, the word line(s) WL, the ground selection line(s) GSL, and the string selection line(s) SSL may be formed on the semiconductor substrate 50. The word lines WL may be formed by connecting a gate pattern (not shown) of a memory cell transistor in one direction. The gate pattern of the memory cell transistor may have a stacked structure including, e.g., a gate insulation layer 62 (i.e., tunnel insulation layer), a floating gate 64a, an inter-gate dielectric layer 66a, and the control gate electrode 68a. In some embodiments, the ground selection line GSL and the string selection line SSL may correspond to gate patterns of the ground selection transistor(s) and the drain selection transistor(s) that may be connected and may extend parallel to the word line(s). The selection lines, e.g., ground selection line(s) GSL and string selection line(s) SSL, may have a structure similar to a gate pattern stacked structure of the memory cell transistor. More particularly, e.g., the gate patterns of the ground selection transistor and the drain selection transistor may have a stacked structure corresponding to a sequentially stacked memory cell transistor. That is, the stacked structure of each ground selection transistor and drain selection transistor may be configured with a gate insulating layer 62, a bottom gate pattern 64b, a dielectric layer pattern 66b, and a top gate pattern 68b. At this stage, the dielectric layer pattern 66b may be partially interposed between the bottom gate pattern 64b and the top gate pattern 68b and may connect the top gate pattern 64b and the bottom gate pattern 68b. In the accompanying figures, a single layer is illustrated as the gate insulation layer 62. However, as discussed above, the gate insulation layer 62 may include different portions, e.g., a tunnel insulation layer and a gate insulation layer, having, e.g., different thicknesses in an active region having cell transistors and an active region having selection transistors, respectively.

Referring to FIG. 3, a hard mask layer 80 may be formed on the control gate electrode 68a and the top gate pattern 68b. An ion implantation mask 84 may then be formed on portion(s) of the semiconductor substrate 50. More particularly, e.g., the ion implantation mask 84 may be formed on the hard mask layer 80 and/or the control gate electrode 68a and the top gate pattern 68b. The ion implantation mask 84 may expose active region(s) of the substrate between the word lines WL. The ion implantation mask 84 may cover a region of the semiconductor substrate 50 where the ground selection line(s) GSL and the string selection line(s) SSL are disposed, but may expose a region of the semiconductor substrate 50 where the word lines WL are disposed.

As illustrated in, e.g., FIG. 3, in some embodiments of the invention, the ion implantation mask 84 may cover adjacent ground selection lines GSL, an active region between the adjacent ground selection lines GSL, and an active region between the ground selection line GSL and the word line WL adjacent thereto. Additionally, the ion implantation mask 84 may cover adjacent string selection lines SSL, an active region between the adjacent string selection lines SSL, and an active region between the ground selection line SSL and the word line WL adjacent thereto.

In some embodiments of the invention, as shown in FIG. 3, by employing the ion implantation mask 84, additional channel impurity(ies) 76 may be selectively implanted into the exposed active region(s) to form an additional channel impurity layer 78 in active region(s) between the word lines WL. The additional channel impurity layer 78 may be diffused toward a predetermined portion of a semiconductor substrate 50 in a side direction, and can be diffused into a channel under the respective word line WL, i.e., into the edges of the channel of the respective cell transistor.

Although not shown, after removing the ion implantation mask 84, a conventional manufacturing process for a flash memory device may be performed to form a source region and a drain region in the active region between the word lines WL, the ground selection lines GSL, and the string selection lines SSL.

In embodiments of the invention, the channel impurity concentration of the cell transistor may become higher than the channel impurity concentration of the selection transistors, e.g., ground selection transistor and the string selection transistor due to the additional impurity implantation. As a result, data maintaining characteristics of the cell transistor (s) may be improved. Also, hot carrier characteristics of the selection transistor(s), e.g., ground selection transistor(s) and the string selection transistor(s), may be improved. Additionally, embodiments of the invention enable gate induced drain leakage (GIDL) to be suppressed.

Figure 4:
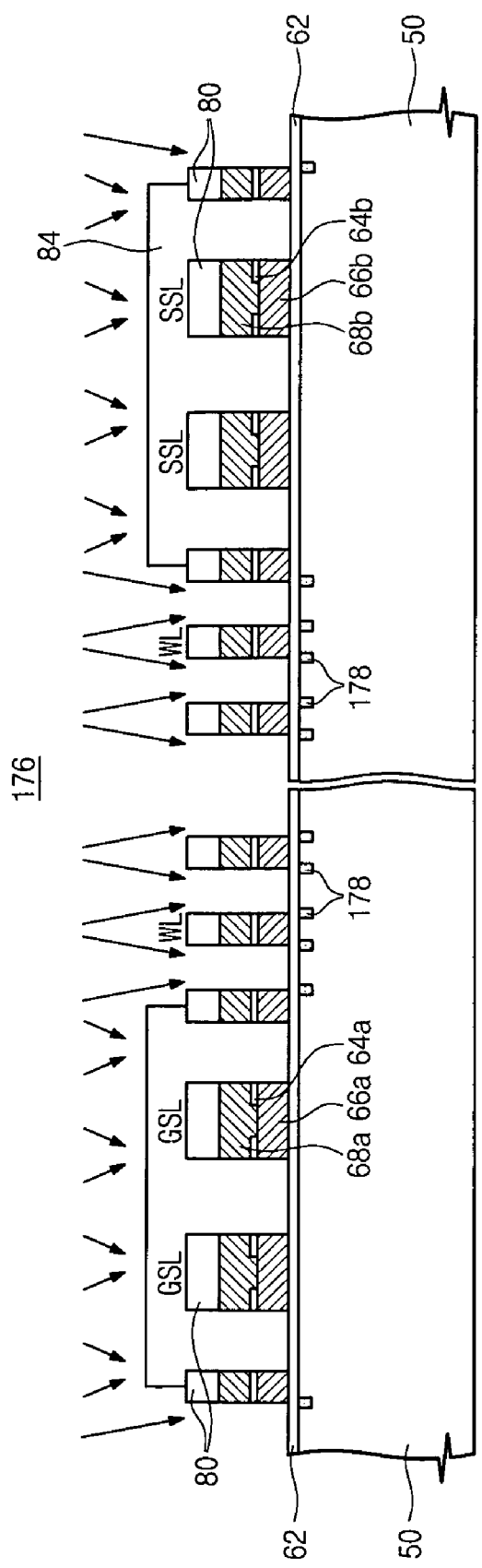
FIG. 4 illustrates a partial cross-sectional view of the exemplary flash memory device shown in FIG. 1, taken along line II-II' of FIG. 1 for describing a method for fabricating a flash memory device according to a second exemplary embodiment of the present invention.

FIG. 4 illustrates a partial cross-sectional view of the exemplary flash memory device shown in FIG. 1, taken along line II-II' of FIG. 1 for describing a method for fabricating a flash memory device according to a second exemplary embodiment of the present invention.

Referring to FIG. 4, the second exemplary method for fabricating a memory device may involve processes similar to those of the first embodiment. In general, only differences between the first and second exemplary embodiments will be described below. More particularly, as illustrated in FIG. 3, in the first exemplary embodiment, the additional channel impurity(ies) 76 may employ a vertical impurity(ies) implantation method, while in the second exemplary embodiment, a tilted ion implantation method may be employed to implant additional channel impurity 176 into an active region.

Referring to FIG. 4, by using tilted ion implantation method, impurity(ies) may be directly implanted into a bottom of a channel region of the respective memory cell transistor(s). Thus, in such embodiments of the invention, an additional channel impurity layer 178 may be diffused toward a center of the channel region. Therefore, a channel impurity concentration of the memory cell transistor(s) may be further increased.

Figure 5:
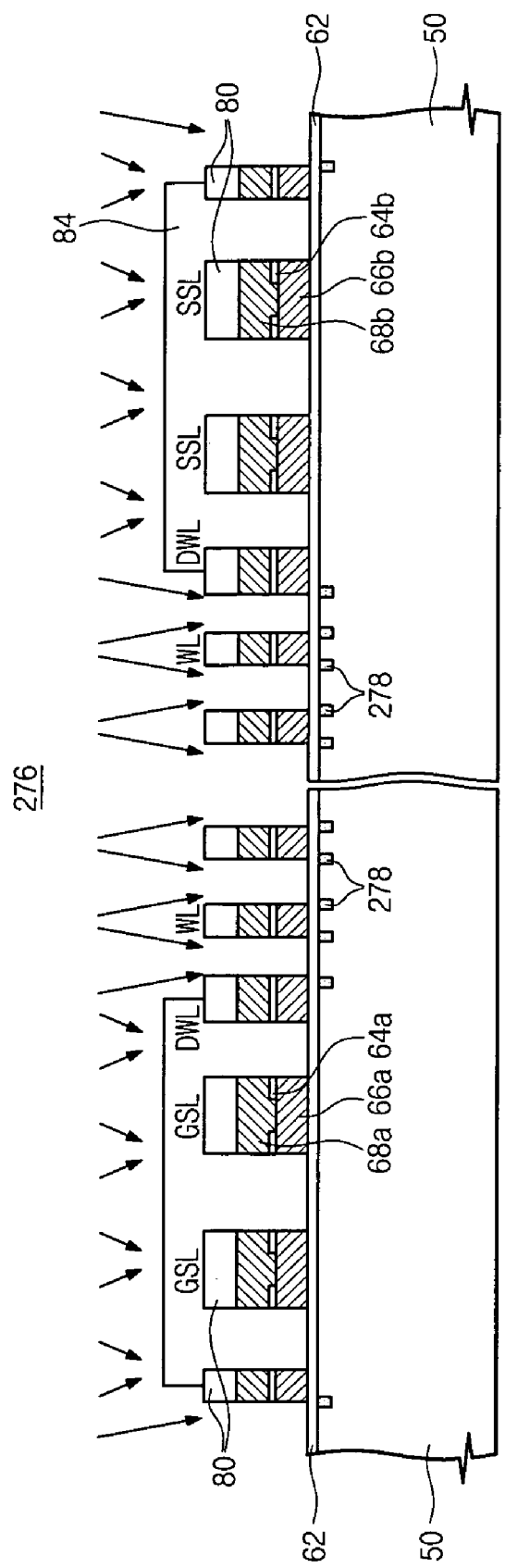
FIG. 5 illustrates a partial cross-sectional view of the exemplary flash memory device shown in FIG. 1, taken along line II-II' of FIG. 1 for describing a method for fabricating a flash memory device according to a third exemplary embodiment of the present invention.

FIG. 5 illustrates a partial cross-sectional view of the exemplary flash memory device shown in FIG. 1, taken along line II-II' of FIG. 1 for describing a method for fabricating a flash memory device according to a third exemplary embodiment of the present invention.

Referring to FIG. 5, in the third exemplary embodiment, dummy word lines DWL may be formed, respectively, between an outmost one of the word lines WL and the adjacent ground selection line GSL, and the outmost one of the word lines WL and the string selection line SSL. The dummy word line DWL may have a structure identical to that of the word line WL. A dummy cell transistor may be provided between an outermost of the memory cell transistor (s) and the adjacent selection transistor. Although the dummy cell transistor does not contribute to a memory capacity, because it may be formed at a portion where hot carrier effects and GIDL may generally occur, the dummy cell transistor(s) may effectively reduce and/or eliminate undesired characteristics, e.g., hot carrier effects and/or GIDL, that may negatively affect operation of the memory cell transistor(s). In particular, the dummy cell transistor(s) may effectively reduce and/or eliminate write and erase defects in the outermost memory cell transistor.

The third exemplary embodiment illustrated in FIG. 5 may substantially correspond to the first and second exemplary embodiments described above. Thus, in the following description of the exemplary embodiment illustrated in FIG. 5, in general, only differences between the first, second and/or third exemplary embodiments will be described. Referring to FIG. 5, an ion implantation mask 84' may be formed to cover the ground selection lines, active region(s) between the ground selection lines GSL, the string selection lines SSL, active region(s) between the string selection lines SSL, and active region(s) between the ground selection line SSL and the dummy word line DWL. Then, e.g., by using a method identical to that of the first embodiment or the second embodiment, an additional channel impurity 276 may be implanted into active region(s) between word lines WL, and active region(s) between the word line WL and the dummy word line DWL.

Figure 6A:
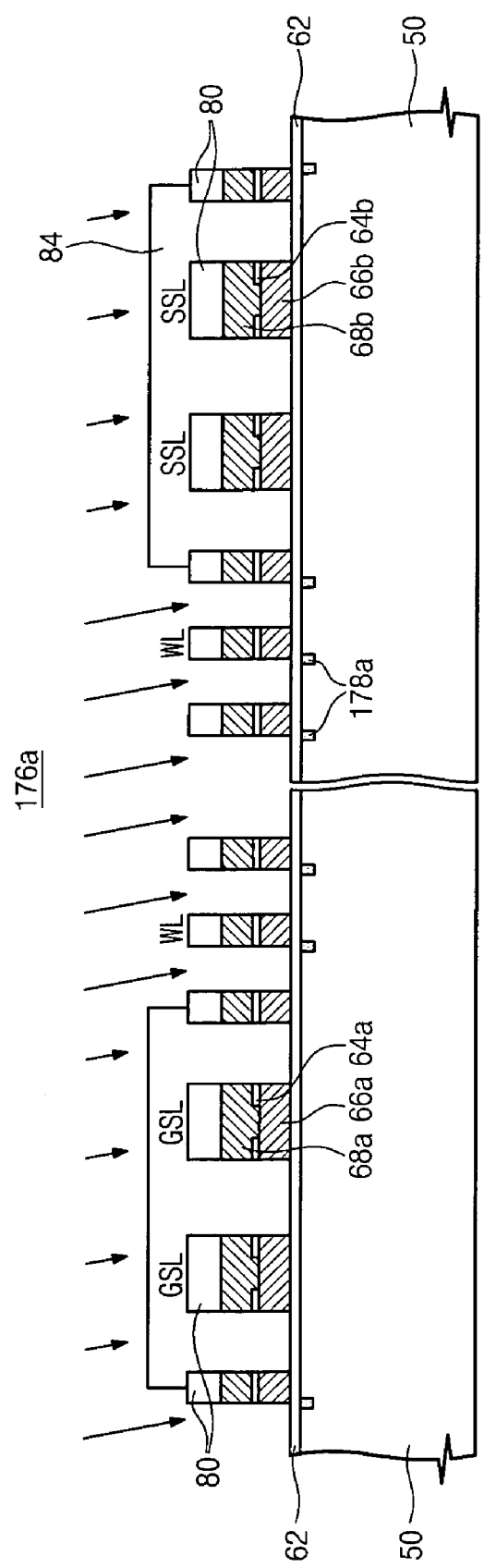
FIGS. 6A and 6B illustrate partial cross-sectional views of the exemplary flash memory device shown in FIG. 1, taken along line II-II' of FIG. 1 for describing a method for fabricating a flash memory device according to a fourth exemplary embodiment of the present invention.
Figure 6B:
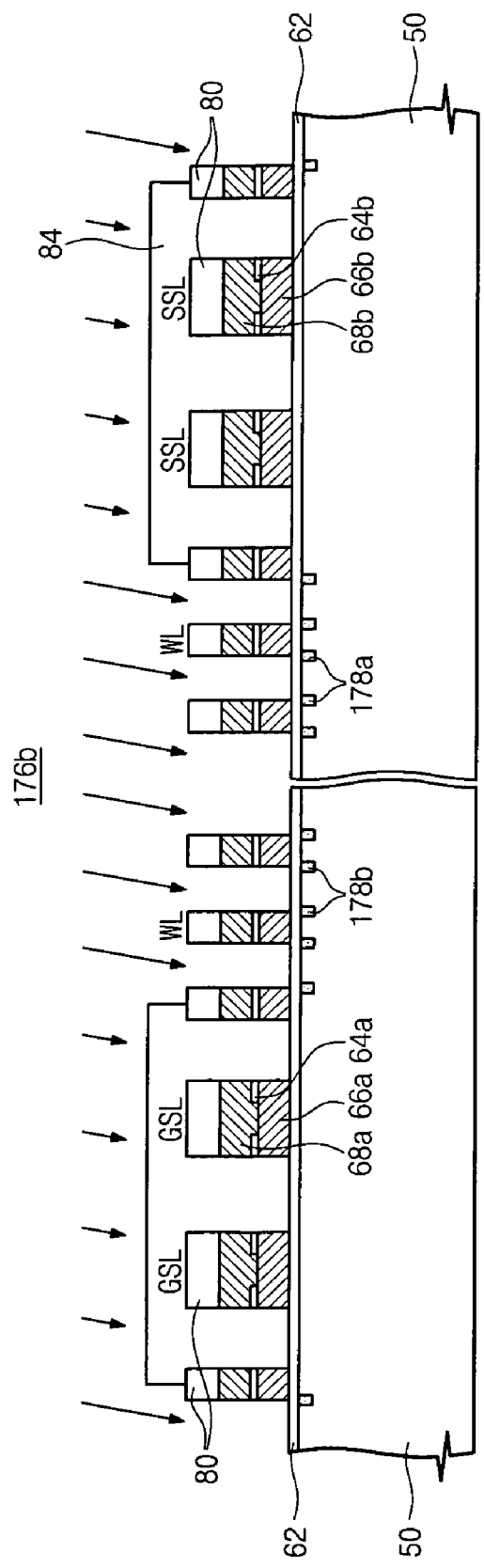

FIGS. 6A and 6B illustrate partial cross-sectional views of the exemplary flash memory device shown in FIG. 1, taken along line II-II' of FIG. 1 for describing a method for fabricating a flash memory device according to a fourth exemplary embodiment of the present invention.

The fourth exemplary embodiment illustrated in FIGS. 6A and 6B may substantially correspond to the second exemplary embodiment described above. Thus, in general, only differences between the fourth exemplary embodiment and the second exemplary embodiment described above will be described below.

More particularly, in the second exemplary embodiment illustrated in FIG. 4, tilted channel impurity implantation may be simultaneously performed in multiple, e.g., two directions, with respect to the word line WL(s). In the fourth exemplary embodiment illustrated in FIGS. 6A and 6B, a first additional channel impurity 176a may be implanted by a tilted ion implantation in a first direction, and a second additional channel impurity 176b may be implanted by the tilted ion implantation in a second direction. As a result, as shown in FIGS. 6A and 6B, a first additional channel impurity layer 178a and a second additional channel impurity layer 178b may be formed.

Figure 7B:
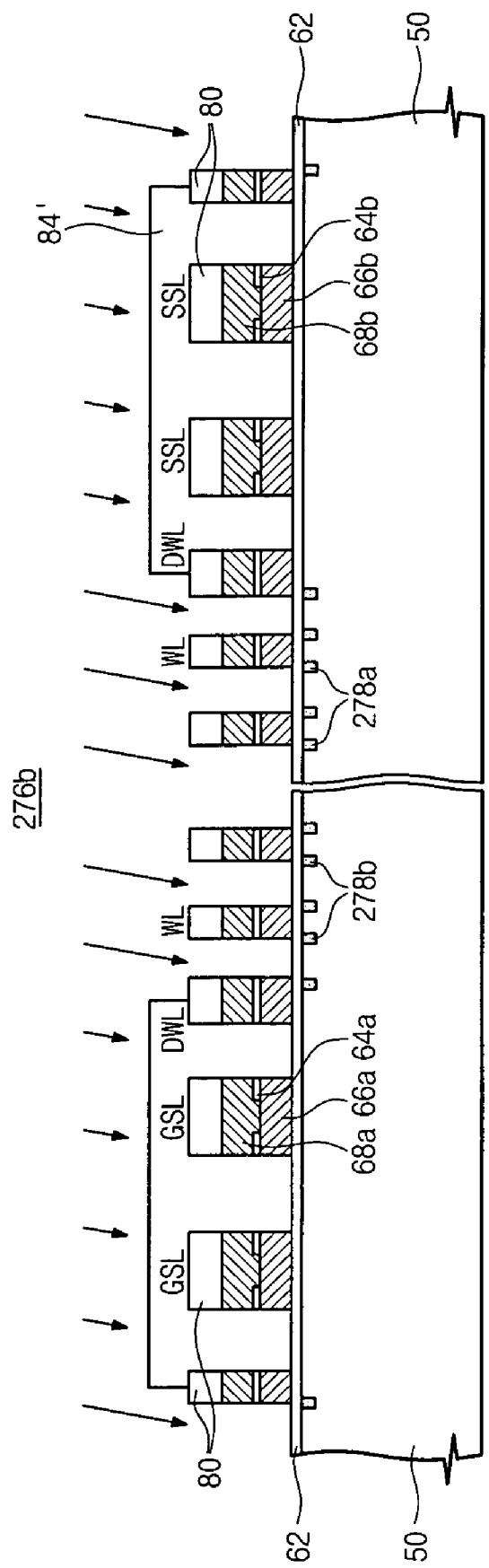

FIGS. 7A and 7B illustrate partial cross-sectional views of the exemplary flash memory device shown in FIG. 1, taken along line II-II' of FIG. 1 for describing a method for fabricating a flash memory device according to a fifth exemplary embodiment of the present invention.

The fifth exemplary embodiment illustrated in FIGS. 7A and 7B may substantially correspond to the third exemplary embodiment described above. Thus, in general, only differences between the fifth exemplary embodiment and the third exemplary embodiment described above will be described below.

More particularly, in the third exemplary embodiment, channel impurity implantation may be performed simultaneously in multiple directions with respect to the word line(s) WL using tilted ion implantation. Referring to FIGS. 7A and 7B, according to the fifth exemplary embodiment, a first additional channel impurity 186a may be implanted by the tilted ion implantation in a first direction and a second additional channel impurity 186b may be implanted by the tilted ion implantation in a second direction. As a result, as shown in FIGS. 7A and 7B, a first additional channel impurity layer 278a and a second additional channel impurity layer 278b may be formed.

The first through fifth embodiments described above correspond to a floating gate-type flash memory device. However, as discussed above, embodiments of the invention may apply to other types of memory devices, e.g., charge trapping-type flash memory device.

Figure 8:
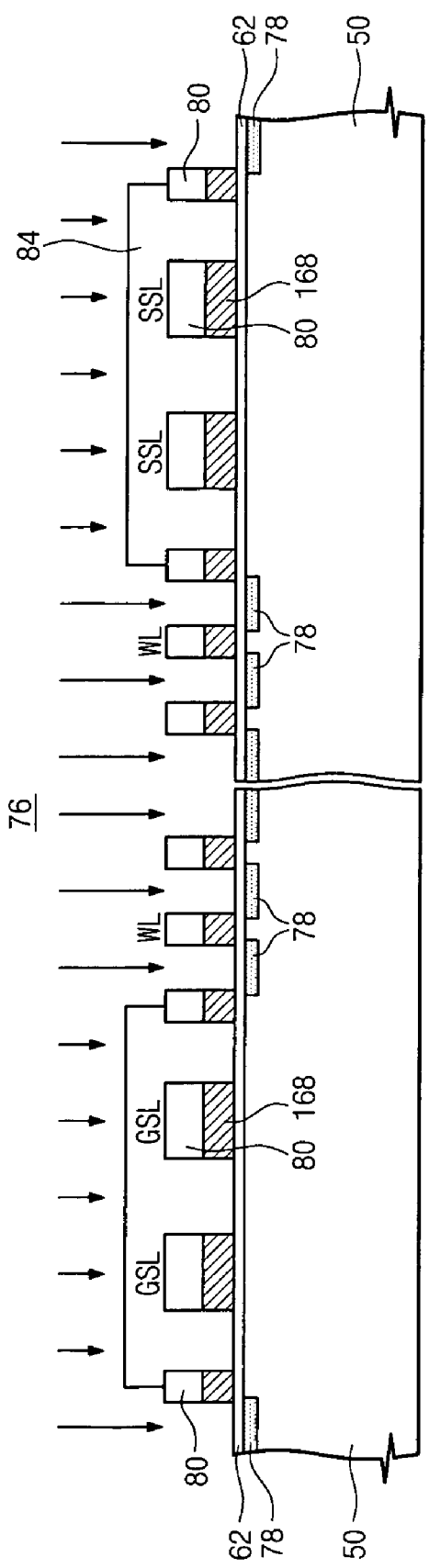
FIG. 8 illustrates a partial cross-sectional view of a second exemplary embodiment of a flash memory device according to one or more aspects of the invention.
Figure 9:
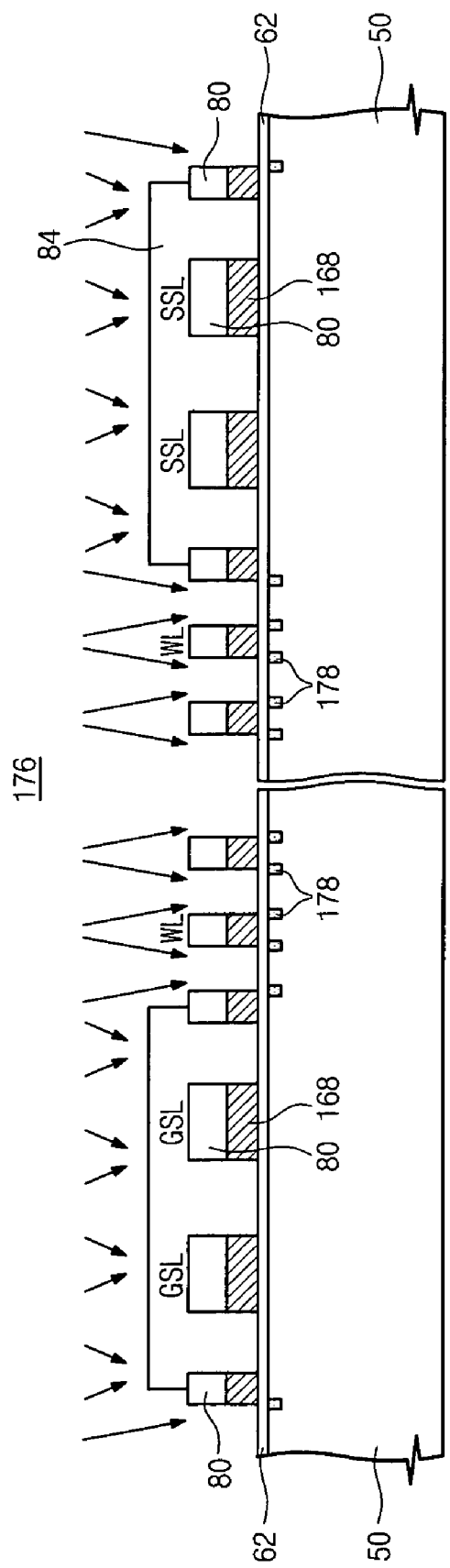
FIG. 9 illustrates a partial cross-sectional view of a third exemplary embodiment of a flash memory device according to one or more aspects of the invention.
Figure 10:
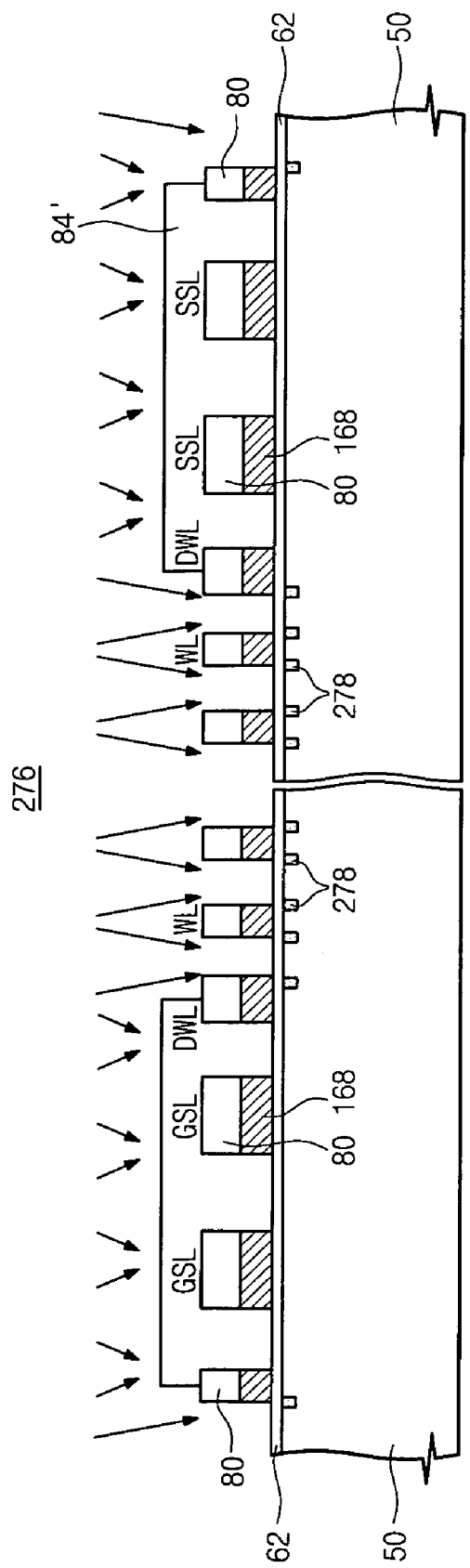
FIG. 10 illustrates a partial cross-sectional view of a fourth exemplary embodiment of a flash memory device according to one or more aspects of the invention.
Figure 11A:
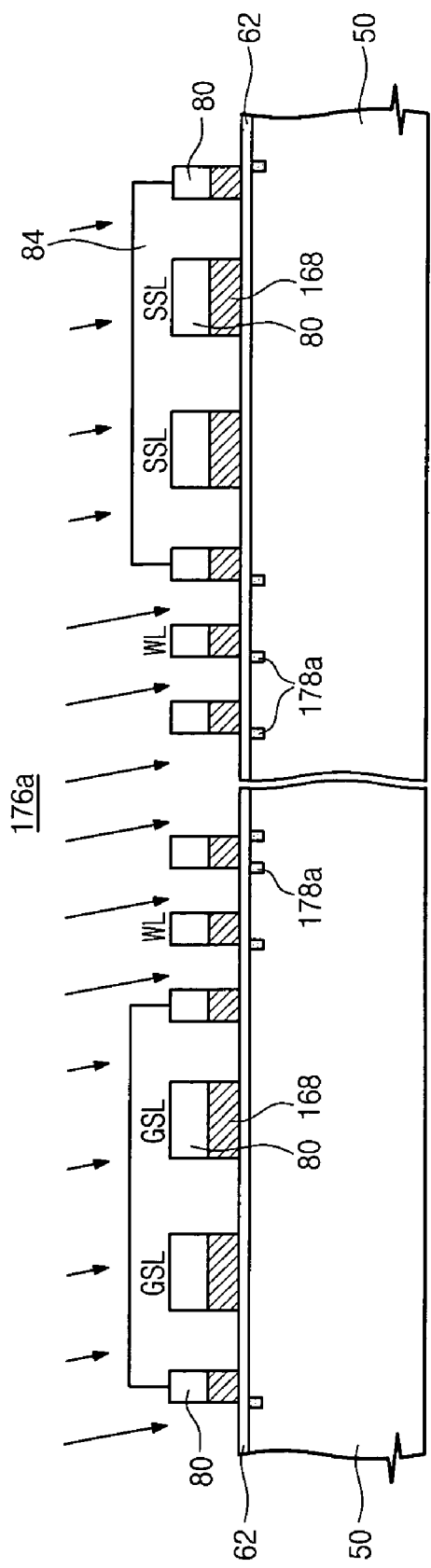
FIGS. 11A and 11B illustrate partial cross-sectional views of a fifth exemplary embodiment of a flash memory device according to one or more aspects of the invention.
Figure 11B:
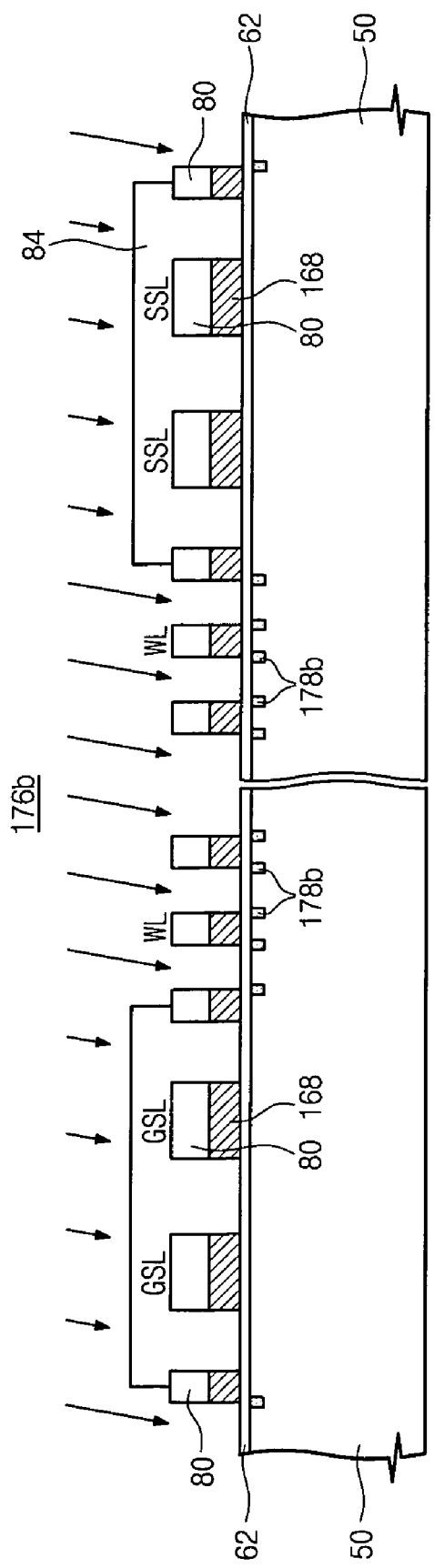
Figure 12A:
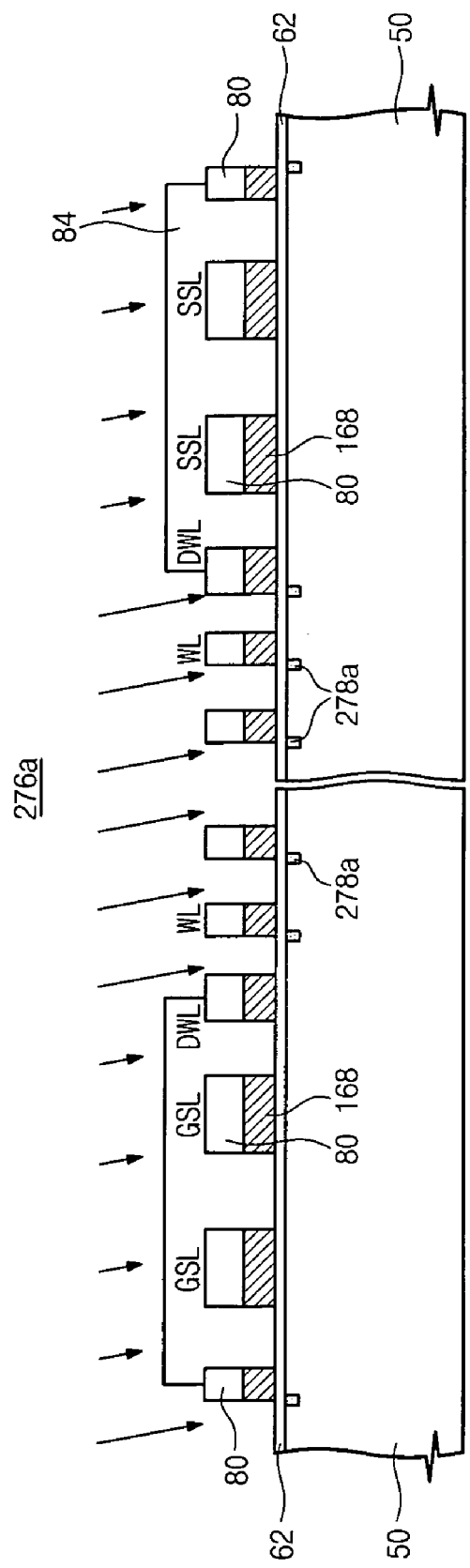
FIGS. 12A and 12B illustrate partial cross-sectional views of a sixth exemplary embodiment of flash memory device according to one or more aspects of the invention.
Figure 12B:
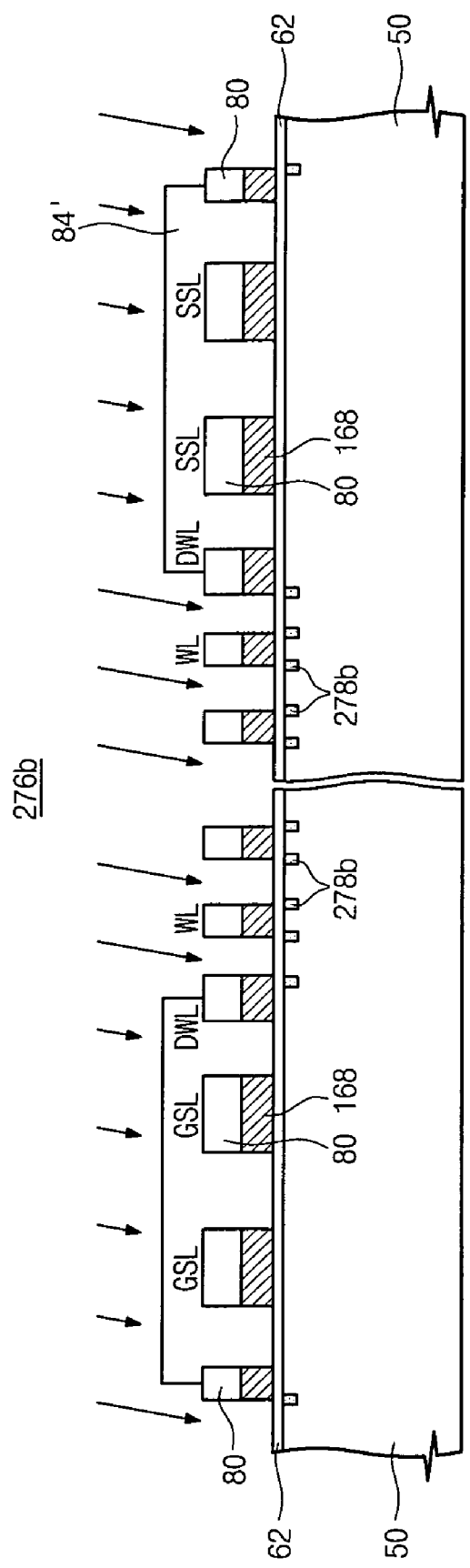

FIG. 8 illustrates a partial cross-sectional view of a second exemplary embodiment of a flash memory device according to one or more aspects of the invention. FIG. 9 illustrates a partial cross-sectional view of a third exemplary embodiment of a flash memory device according to one or more aspects of the invention. FIG. 10 illustrates a partial cross-sectional view of a fourth exemplary embodiment of a flash memory device according to one or more aspects of the invention. FIGS. 11A and 11B illustrate partial cross-sectional views of a fifth exemplary embodiment of a flash memory device according to one or more aspects of the invention. FIGS. 12A and 12B illustrate partial cross-sectional views of a sixth exemplary embodiment of flash memory device according to one or more aspects of the invention.

More particularly, FIGS. 8 through 12B generally correspond to FIGS. 3 through 7B as applied to charge trapping-type flash memory devices rather than floating gate type flash memory device. Thus, a detailed description thereof is omitted. Those of ordinary skill in the art appreciate that the exemplary embodiments illustrated in FIGS. 8 through 12B may at least provide one, some or all of the advantages of the other exemplary embodiments described above.

In general, in the charge trapping-type flash memory devices, the word line(s) WL, the ground selection line(s) GSL, and the string selection line(s) SSL may be formed. The word lines WL may correspond to the gate pattern of the memory cell transistor, which are connected in one direction. The gate pattern of the memory cell transistor may have a stacked structure of a multi-layer charge trap insulation layer (not shown) and a control gate electrode 168a. Additionally, the ground selection line(s) GSL and the string selection line(s) SSL may be the gate patterns of the ground selection transistor and the drain selection transistor that may be connected parallel to the word line(s) WL. Thus, the ground selection line(s) GSL and the string selection line(s) SSL may have a structure similar to a gate pattern stacked structure of the memory cell transistor. For example, the gate pattern of the ground selection transistor and the drain selection transistor may have a stacked structure of gate insulation layer corresponding to the sequentially stacked layer, memory cell transistor, and gate pattern 168b. In the accompanying figures, although the multi layered charge trap insulation layer is not distinguished from the gate insulation layer 62, a multi-layered charge trap insulation layer may be formed on an active region having the cell transistor(s), and a single-layered gate insulation layer, e.g., a silicon oxide layer, may be formed on an active region having, e.g., the selection transistors.

As described above, embodiments of the invention may enable, a drop in concentration due to, e.g., impurity diffusion can be compensated for without increasing an overall concentration of the channel impurity layer. Thus, embodiments of the invention may provide flash memory devices having stable characteristics.

Moreover, embodiments of the invention enable a data maintaining characteristic of a cell transistor to be improved and/or GIDL to be reduced and/or prevented around the selection transistor. Thus, embodiments of the invention enable a boosting efficiency to be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
   a cell string having a plurality of cell transistors connected in series; and
   a string selection transistor and a ground selection transistor connected to both ends of the cell string, respectively,
   wherein the cell transistor has a channel impurity concentration higher than a channel impurity concentration of at least one of the string selection transistor and the ground selection transistor.

2. The flash memory device as claimed in claim 1, wherein, in a respective cell transistor of the cell transistors that is closest to one of the string selection transistor and the ground selection transistor, a channel portion adjacent to the string selection transistor or the ground selection transistor has an impurity concentration lower than that of a channel portion adjacent to another cell transistor of the cell transistors.

3. The flash memory device as claimed in claim 1, wherein each of the cell transistors includes a source region and a drain region, and impurity concentrations of channels adjacent to the source region and the drain region are higher than impurity concentrations of the string selection transistor and the ground selection transistor.

4. The flash memory device as claimed in claim 1, wherein each of cell transistors is disposed on an active region, and a channel impurity concentration at an edge of the active region is higher than an impurity concentration of at least one of the string selection transistor and the ground selection transistor.

5. The flash memory device as claimed in claim 1, wherein each of the cell transistors includes:
   a charge trap insulation layer; and
   a gate electrode formed on the charge trap insulation layer.

6. The flash memory device as claimed in claim 5, wherein the charge trap insulation layer includes:
   a tunnel insulation layer;
   a charge trap layer formed on the tunnel insulation layer; and
   a blocking insulation layer formed on the charge trap layer.

7. The flash memory device as claimed in claim 1, wherein each of the cell transistors, includes:
   a tunnel insulation layer;
   a floating gate formed on the tunnel insulation layer;
   an inter-gate dielectric layer formed on the floating gate; and
   a control gate electrode formed on the inter-gate dielectric layer.

8. The flash memory device as claimed in claim 1, further comprising:
   dummy cell transistors formed between at least one of the cell string selection transistor and at least one of the cell transistors and the ground selection transistor and at least on of the cell transistors.

9. The flash memory device as claimed in claim 8, wherein a channel portion adjacent to the cell string in the dummy transistor has an impurity concentration higher than an impurity concentration of a channel portion adjacent to the ground selection transistor or the string selection transistor.

10. The flash memory device as claimed in claim 8, wherein the dummy cell transistor has a stacked structure including same layers as the cell transistor.

11. A method for fabricating a flash memory device, the method comprising:
    forming a cell string having a plurality of cell transistors connected in series, and a string selection transistor and a ground selection transistor connected to both ends of the cell string, respectively, on a semiconductor substrate; and
    implanting a channel impurity on the semiconductor substrate having the cell transistor, the string selection transistor, and the ground selection transistor,
    wherein the cell transistor has a channel impurity concentration higher than an impurity concentration of at least one of the string selection transistor and the ground selection transistor.

12. The method as claimed in claim 11, further comprising, before the forming of the cell string, the string selection transistor, and the ground selection transistor, implanting a channel impurity on the semiconductor substrate.

13. The method as claimed in claim 12, wherein implanting the channel impurity, comprises:
    implanting a first channel impurity on the semiconductor substrate;
    defining an active region by forming a device isolation layer on the semiconductor substrate; and
    implanting a second channel impurity on an edge of the active region, the edge constituting a boundary of the device isolation layer.

14. The method as claimed in claim 11, wherein forming the cell string, the string selection transistor, and the ground selection transistor comprises:
    defining an active region on the semiconductor substrate;
    forming a gate electrode of the cell transistor, a gate electrode of the string selection transistor, a gate electrode of the ground selection transistor, the gate electrodes crossing over the active region; and
    implanting an additional channel impurity at bottom edge portions of the gate electrodes in the cell transistor.

15. The method as claimed in claim 14, wherein implanting the additional channel impurity includes:
    forming a mask pattern covering active regions at both sides of the gate electrode of the string selection transistor and the gate electrode of the ground selection transistor, wherein the mask pattern is used as an ion implantation mask to implant an additional channel impurity into the active region.

16. The method as claimed in claim 15, wherein the additional channel impurity is implanted vertically into an active region between the gate electrodes of the cell transistor.

17. The method as claimed in claim 15, wherein the additional channel impurity is implanted on an active region between the gate electrodes of the cell transistor using a tilted ion implantation method.

18. The method as claimed in claim 14, further comprising forming gate electrodes of dummy cell transistors between a gate electrode at an edge of the cell string, the gate electrode of the string selection transistor, and the gate electrode of the ground selection transistor.

19. The method as claimed in claim 18, wherein implanting the additional channel impurity includes:

forming a mask pattern covering active regions in both sides of the gate electrode of the string selection transistor and the gate electrode of the ground selection transistor, wherein the mask pattern is used as an ion implantation mask to implant an additional channel impurity into the active region.

20. The method as claimed in claim 18, wherein the additional channel impurity is implanted using at least one of a vertical ion implantation method and a tilted ion implantation method into an active region between the gate electrodes of the cell transistor, and between the gate electrode of the cell transistor and the gate electrode of the dummy cell transistor.

* * * * *